(12) United States Patent
Zhang et al.

(10) Patent No.: US 11,909,388 B2
(45) Date of Patent: Feb. 20, 2024

(54) TERMINAL RESISTANCE CIRCUIT, CHIP AND CHIP COMMUNICATION DEVICE

(71) Applicant: SHENZHEN PANGO MICROSYSTEMS CO., LTD, Shenzhen (CN)

(72) Inventors: Qianwen Zhang, Shenzhen (CN); Aimei Liang, Shenzhen (CN); Changqing Wen, Shenzhen (CN); Qiwei Wang, Shenzhen (CN)

(73) Assignee: SHENZHEN PANGO MICROSYSTEMS CO., LTD, Shenzhen (CN)

( * ) Notice: Subject to any disclaimer, the term of this patent is extended or adjusted under 35 U.S.C. 154(b) by 183 days.

(21) Appl. No.: 17/732,564

(22) Filed: Apr. 29, 2022

(65) Prior Publication Data

US 2022/0286128 A1 Sep. 8, 2022

Related U.S. Application Data

(63) Continuation of application No. PCT/CN2021/079745, filed on Mar. 9, 2021.

(30) Foreign Application Priority Data

Dec. 9, 2020 (CN) .......................... 202011449291.4

(51) Int. Cl.
*H03K 17/687* (2006.01)
*G06F 13/20* (2006.01)
*H03K 19/173* (2006.01)

(52) U.S. Cl.
CPC ......... *H03K 17/6872* (2013.01); *G06F 13/20* (2013.01); *H03K 19/173* (2013.01); *G06F 2213/40* (2013.01)

(58) Field of Classification Search
None
See application file for complete search history.

(56) References Cited

U.S. PATENT DOCUMENTS 6,963,219 B1 11/2005 Atul et al.
2013/0141954 A1\* 6/2013 Chang ..................... H02J 9/061
363/84

FOREIGN PATENT DOCUMENTS

CN 1492591 A 4/2004
CN 101741375 A 6/2010
(Continued)

OTHER PUBLICATIONS

CNIPA, First Office Action for CN Application No. 202011449291.4, dated Sep. 3, 2021.
(Continued)

*Primary Examiner* — Cassandra F Cox

(57) ABSTRACT

A terminal resistance circuit, a chip and a chip communication device are provided. The terminal resistance circuit can be used for a high-speed differential I/O pair and includes two resistance circuits and a control circuit. An end of the two resistance circuits connected in series is connected to a first interface and another end is connected to a second interface. A conductor wire connected between the two resistance circuits has a target node thereon. The two resistance circuits are symmetrically arranged relative to the target node. The control circuit is connected to the two resistance circuits individually and used to control the two resistance circuits each to be in a turn-off state during powering-on of the chip. An abnormal operation caused by a short circuit between two interfaces of a I/O pair during the powering-on of the chip is avoided and the working stability of the chip is improved.

20 Claims, 4 Drawing Sheets

(56) References Cited

FOREIGN PATENT DOCUMENTS

| | | |
|---|---|---|
| CN | 202159474 U | 3/2012 |
| CN | 102893567 A | 1/2013 |
| CN | 103853078 A | 6/2014 |
| CN | 106059553 A | 10/2016 |
| CN | 206077349 U | 4/2017 |
| CN | 106817140 A | 6/2017 |
| EP | 0621695 A2 | 10/1994 |
| JP | 2019061402 A | 4/2019 |

OTHER PUBLICATIONS

Fieldbus terminal resistance remote Fieldbus terminal resistance remote Design method and experiment of configuration validation, Ding Jie et al., Dec. 31, 2018, pp. 137-141.
CNIPA, Office Action issued for CN Application No. 202011449291.4, dated Oct. 13, 2021.
WIPO, International Search Report for PCT Application No. PCT/CN2021/079745, dated Sep. 9, 2021.
Written Opinion of the International Searching Authority for No. PCT/CN2021/079745.

\* cited by examiner

TERMINAL RESISTANCE CIRCUIT, CHIP AND CHIP COMMUNICATION DEVICE

CROSS-REFERENCE TO RELATED APPLICATIONS

The present disclosure is a continuation of International Application No. PCT/CN2021/079745, filed on Mar. 9, 2022. The international application claims priority from Chinese patent application No. 202011449291.4, filed on Dec. 9, 2020. The entire contents of the above-mentioned applications are hereby incorporated herein by reference.

TECHNICAL FIELD

The present disclosure relates to semiconductor integrated circuit (IC) technologies, and in particularly, to a terminal resistance circuit, a chip and a chip communication device.

BACKGROUND

With the rapid development of integrated circuits, a field programmable gate array (FPGA) chip, as a programmable logic device, has gradually evolved from a peripheral device for an electronic design to a core of a digital system in just over 20 years. With the progress of semiconductor process technologies, a design technology of the FPGA chip has also made a leap forward development and breakthrough. Because the FPGA chip has characteristics of high density, high confidentiality, low power consumption, low cost, system integratable and dynamic reconfigurable, the FPGA chip has been widely used in the fields of communication, aerospace, consumer electronics and so on.

However, at present, the FPGA chip usually has an issue of a terminal resistor between two ends of a high-speed differential input/output (I/O) pair being conducted during the powering-on of the FPGA chip, resulting in a short circuit between the two ends of the high-speed differential I/O pair, and thereby causing an abnormal operation of system of the FPGA chip.

SUMMARY

In view of the above problems, the present disclosure provides a terminal resistance circuit, a chip and a chip communication device to solve the above problems.

In a first aspect, an embodiment of the present disclosure provides a terminal resistance circuit, adapted for a high-speed differential I/O pair of a chip; the high-speed differential I/O pair includes a first interface and a second interface, and the terminal resistance circuit includes: two resistance circuits and a control circuit, an end of the two resistance circuits connected in series is electrically connected to the first interface, and another end of the two resistance circuits connected in series is electrically connected to the second interface, a conductor wire connected between the two resistance circuits has a target node thereon, and the two resistance circuits are symmetrically arranged with respect to the target node; and the control circuit is electrically connected to the two resistance circuits individually and configured to control the two resistance circuits each to be in a turned-off state during powering-on of the chip.

In a second aspect, an embodiment of the present disclosure provides a chip, the chip includes a FPGA chip body and the terminal resistance circuit of the first aspect, the high-speed differential I/O pair of the FPGA chip body includes the first interface and the second interface, and the terminal resistor circuit is electrically connected to the first interface and the second interface.

In a third aspect, an embodiment of the present disclosure provides a chip communication device, the chip communication device includes a first FPGA chip, a second FPGA chip, a first transmission line, a second transmission line and three the terminal resistance circuits of the first aspect; the three terminal resistance circuits include a first terminal resistance circuit, a second terminal resistance circuit and a third terminal resistance circuit; a high-speed differential I/O pair of the first FPGA chip includes a first port and a second port, and a high-speed differential I/O pair of the second FPGA chip includes a third port and a fourth port; the first port of the first FPGA chip is electrically connected to the third port of the second FPGA chip through the first transmission line, and the second port of the first FPGA chip is electrically connected to the fourth port of the second FPGA chip through the second transmission line; the first terminal resistance circuit is electrically connected to the first port of the first FPGA chip and the second port of the first FPGA chip, and the first terminal resistance circuit is integrated in the first FPGA chip; the second terminal resistance circuit is electrically connected to the third port of the second FPGA chip and the fourth port of the second FPGA chip, and the second terminal resistance circuit is arranged outside the second FPGA chip; the third terminal resistance circuit is electrically connected to the third port of the second FPGA chip and the fourth port of the second FPGA chip, and the third terminal resistance circuit is integrated in the second FPGA chip.

BRIEF DESCRIPTION OF THE DRAWINGS

In order to explain technical solutions in embodiments of the present disclosure more clear, the drawings used in the description of the embodiments will be briefly introduced below. It is apparent that the drawings in the following description are only some of embodiments of the present disclosure. For those skilled in the art, other drawings can be obtained according to these drawings without paying creative effort.

DETAILED DESCRIPTION OF EMBODIMENTS

Figure 1:
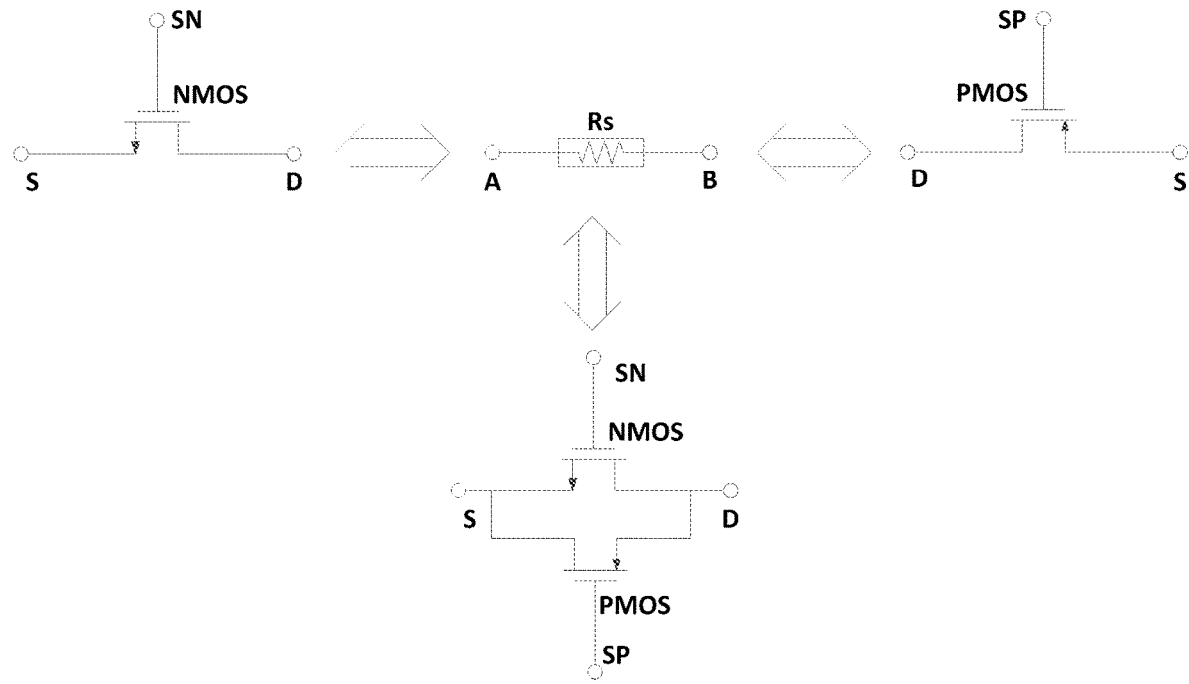
FIG. 1 illustrates an equivalent schematic view of MOS switches according to an embodiment of the present disclosure.

In order to make purposes, technical solutions and advantages of embodiments of the present disclosure clearer, the technical solutions in the embodiments of the present disclosure will be clearly and completely described below in combination with the accompanying drawings in the embodiments of the present disclosure. Apparently, the described embodiments are some of embodiments of the present disclosure, not all of embodiments of the present disclosure. Generally, components of the embodiments of the present disclosure described and shown in the drawings herein may be arranged and designed in a variety of different configurations.

Therefore, the following detailed description of the embodiments of the present disclosure provided in conjunction with the accompanying drawings is not intended to limit the scope of the present disclosure, and only represents selected embodiments of the present disclosure. Based on the embodiments in the present disclosure, all other embodiments obtained by those skilled in the art without creative effort belong to the scope of protection of the present disclosure.

It should be noted that similar labels and letters represent similar items in the accompanying drawings. Therefore, once an item is defined in one drawing, it does not need to be further defined and explained in subsequent drawings.

In the description of the present disclosure, it should be noted that the terms "first", "second", "third" and the like are only used to distinguish the components, and cannot be understood as indicating or implying relative importance.

In the description of the present disclosure, it should also be noted that, unless otherwise specified and limited, the terms "arranged", "installed", "connected with" and "connected to" should be understood in a broad sense. For example, it can be fixed connection, detachable connection or integrated connection. It can be mechanical connection or electrical connection. It can be direct connection or indirect connection through an intermediate medium, and it can be internal connection between two components. For those skilled in the art, specific meanings of the above terms in the present disclosure can be understood as per specific circumstances.

The technical solutions in the embodiments of the present disclosure will be described clearly and completely below in combination with the accompanying drawings in the embodiments of the present disclosure. Apparently, the described embodiments are only some of embodiments of the present disclosure, not all of embodiments of the present disclosure. Based on the described embodiments in the present disclosure, all other embodiments obtained by those skilled in the art without creative effort should belong to the scope of protection of the present disclosure.

A FPGA chip can provide users with rich input and output pin resources, and an input and output module (JOB) of the FPGA chip needs to support one or more interface protocols. With the development of semiconductor process technologies, a chip feature size has been reduced to 28 nm, 16 nm, 7 nm, or even 5 nm. A scale of the FPGA chip is increasing correspondingly, and the function of the FPGA chip is becoming more and more powerful. The FPGA chip needs to interact with a variety of external chips and support a variety of voltage types, just as one I/O pair needs to support 1.8V, 1.5V and 1.2V voltage standards to realize complex logic functions, so that an I/O design of the FPGA chip, especially a high-speed differential I/O design, is facing challenges.

According to physical knowledge of semiconductor devices, as shown in FIG. 1, an N-type metal-oxide-semiconductor (NMOS) transistor or a P-type metal-oxide-semiconductor (PMOS) transistor operating in a deep linear region can be equivalent to a resistor Rs. Its two terminals of source and drain are equivalent to two ends of the resistor. Ron_N is a resistance of the NMOS switch when SN=VDD, and Ron_P is a resistance of the PMOS switch when SP=VSS.

Figure 2:
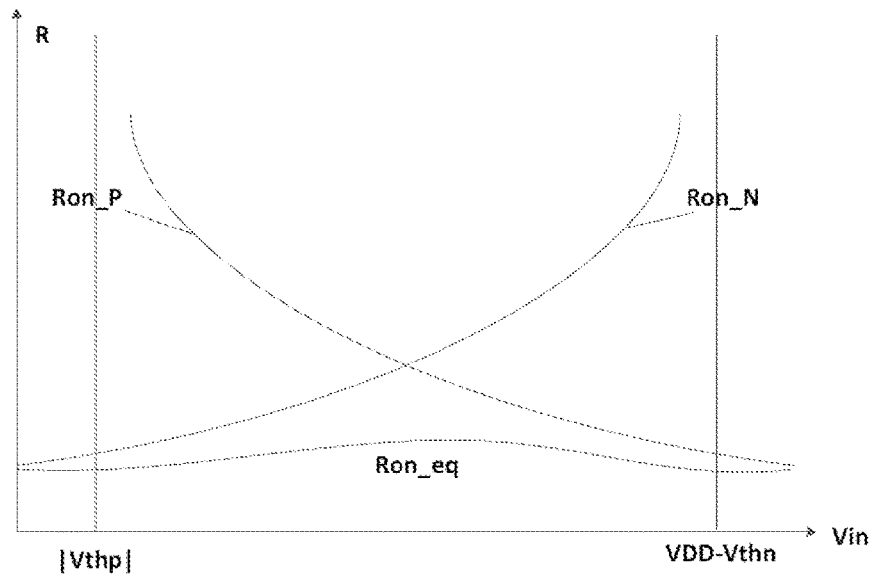
FIG. 2 illustrates a schematic diagram of a relationship between a resistance value of an equivalent resistor of NMOS and PMOS connected in parallel and an input voltage according to an embodiment of the present application.

When the NMOS and the PMOS are connected in parallel, a complementary switch conduction resistor is formed. As shown in FIG. 2, an equivalent resistance of the complementary switch conduction resistor is Ron_eq. In FIG. 2, Vin represents a voltage value of A/B (or S/D) ends of the resistor. In the related art, the complementary switch conduction resistor composed of the NMOS and the PMOS can be designed as a terminal resistance of a I/O module according to the Low-Voltage Differential Signaling (LVDS) standard or Mobile Industry Processor Interface (MIPI) standard. When a voltage SN on a control terminal is at a high level and a voltage SP on another control terminal is at a low level, the equivalent resistance Ron_eq of the resistor can be seen from FIG. 2.

Figure 3:
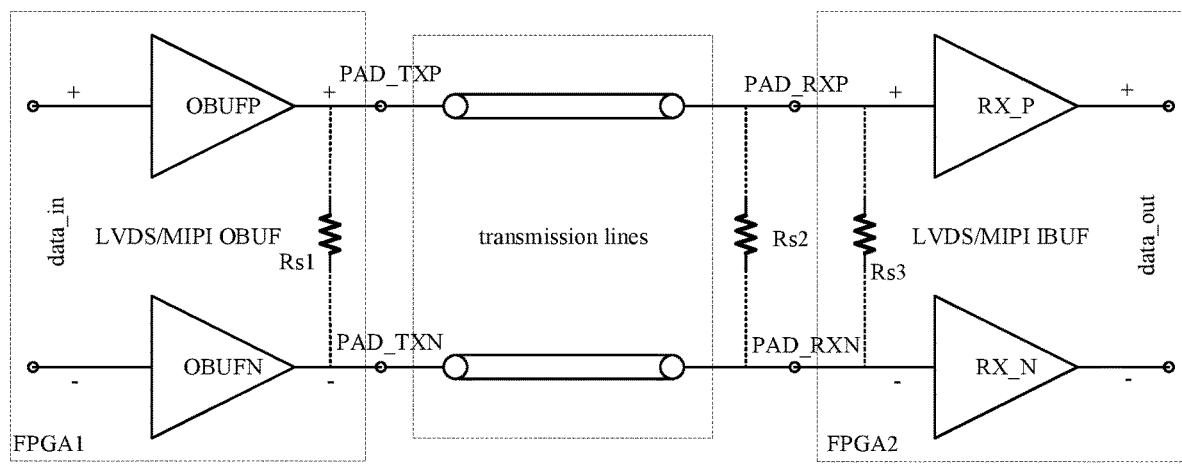
FIG. 3 illustrates a schematic connection diagram of applying differential terminal resistors Rs to high-speed differential I/O pairs of chips according to an embodiment of the present disclosure.

According to the LVDS and MIPI standards, a typical value of the differential terminal resistor Rs is 100Ω, that is, when applying in the IOB supporting the LVDS and MIPI standards, it is necessary to connect the differential terminal resistor Rs in series between designed one pair of differential I/Os. when applying the differential terminal resistor Rs to the high-speed differential I/O pair of a chip, a specific connection manner can be seen from FIG. 3. In the FPGA chip (hereinafter referred to chip for short), I/Os supporting the LVDS and the MIPI differential standards are placed in adjacent positions. Communication between a FPGA1 and a FPGA2 mainly includes three parts, i.e., LVDS/MIPI OBUF, transmission lines, and LVDS/MIPI IBUF. The OBUF, as a data transmitter, is responsible for transmitting data data_in of the FPGA1 out through output I/O ends (ports) PAD_TXP and PAD_TXN of the respective OBUFP and the OBUFN, and then the data after passing through the transmission lines enter the FPGA2 via PAD_RXP and PAD_RXP. LVDS/MIPI IBUF of the FPGA2 can restore the data in accordance with the LVDS and MIPI standards, and then output data_out to an internal logic circuit of the chip.

The inventors found that in the design of the IOB of FPGA chip, a terminal resistor Rs1 may exist between two pads of OBUF, or it cannot be used, and can be configured through configuration points. In a practical application, at a receiving end of the chip, for the LVDS and MIPI (high-speed mode) protocols of differential standards, it is specified that there must be a terminal resistor with a resistance value of about 100Ω, the terminal resistor can be placed on a PCB circuit or integrated inside the FPGA2. As shown in FIG. 3, Rs2 can be placed on the PCB close to the PAD_RXP and PAD_RXN, Rs3 can be integrated inside the FPGA2, and only one of the Rs2 and the Rs3 is in a turn-on state.

As shown in FIG. 3, in the related art, a complementary metal-oxide-semiconductor (MOS) switch resistor or a complementary switch resistor connecting a polysilicon resistor in series is employed to be equivalent as the terminal resistor Rs. When the complementary MOS switch is used as the terminal resistor, the gate SN of the NMOS and the gate SP of the PMOS can be used as the control ends of the resistor. When SN=VDD and SP=VSS, the switch resistor is in a turn-on state, whereas when SN=VSS and SP=VDD, the switch resistor is in a turn-off state, and an open-circuit resistance is very large.

However, there is a problem in the use of the circuit: when the FPGA chip is not powered on, that is the FPGA1 is not powered on, the gate voltage of PMOS of the terminal resistance Rs1 is SP=0, the PMOS is in the turn-on state. At this time, if the PAD_TXP and PAD_TXN are driven by FPGA2, and one of them is at a high level while the other one is at a low level, the Rs1 will be in the turn-on state to make the PAD_RXP and PAD_RXN of FPGA2 be short circuited by Rs1 and the transmission lines, which would lead to abnormal operation. Such working mechanism imposes requirements on a power-on sequence of chip, which would affect the use of users to a certain extent.

Therefore, in view of the above problems, the inventors propose a terminal resistance circuit, a chip and a chip communication device in embodiments of the present disclosure, the terminal circuit can be adapted for two ends of a high-speed differential I/O pair of a chip, thereby making the two ends of the high-speed differential I/O pair be in a turn-off state during powering-on of the chip, so as to avoid an abnormal operation of the system of the chip caused by the short-circuit of the two ends of the high-speed differential I/O pair during the powering-on of the chip, the working stability of the chip is improved consequently.

Figure 4:
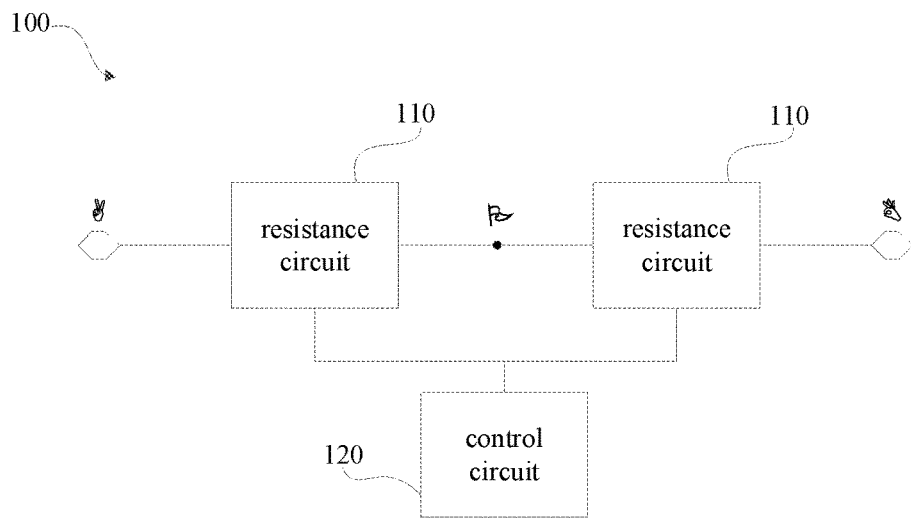
FIG. 4 illustrates a principle block diagram of a terminal resistance circuit according to an embodiment of the present disclosure.

Please refer to FIG. 4, which illustrates a principle block diagram of a terminal resistance circuit provided by an embodiment of the present disclosure. The terminal resistance circuit 100 can be adapted for a high-speed differential I/O pair of a chip, and the high-speed differential I/O pair includes a first interface A and a second interface B.

As shown in FIG. 4, the terminal resistance circuit 100 may include: two resistance circuits 110 and a control circuit 120. An end of the two resistance circuits 110 connected in series is electrically connected to the first interface A, and another end of the two resistance circuits 110 connected in series is electrically connected to the second interface B. A conductor wire connected between the two resistance circuits 110 has a target node P thereon, and the two resistance circuits 110 may be symmetrically arranged with respect to the target node P.

The control circuit 120 can be electrically connected to the two resistance circuits 110 individually, and configured (i.e., structured and arranged) to control the two resistance circuits 110 each to be in a turn-off state during powering-on of the chip.

In a practical application, the control circuit 120 determines whether the chip is in a powering-on process based on a power-on reset signal of the chip. If it is determined that the chip is in the powering-on process, the control circuit 120 can send control information to the two resistance circuits 110 to control the two resistance circuits 110 each to be in the turn-off state, thereby avoiding abnormal operation of the system of the chip caused by electrical conduction of the terminal resistance circuit 100 during the powering-on process, which can improve the working stability of the chip. The control information includes but is not limited to control voltages. Since the two resistance circuits 110 are symmetrically arranged with respect to the target node P, the differential output of the high-speed differential I/O pair of the chip can be met.

Figure 5:
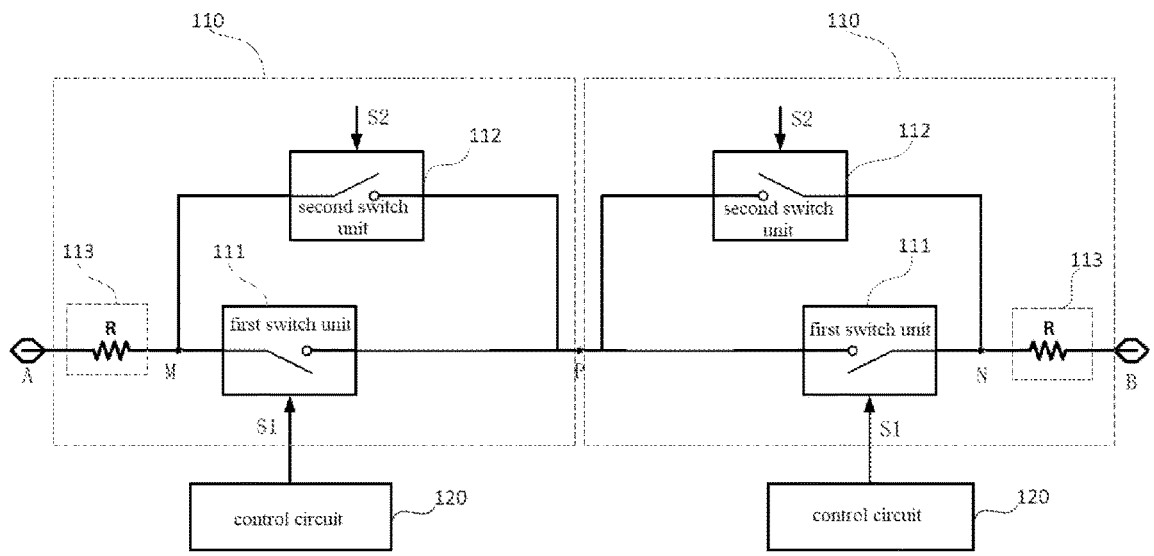
FIG. 5 illustrates a schematic structural view of a terminal resistance circuit according to an embodiment of the present disclosure.

As shown in FIG. 5, the resistance circuit 110 may include a resistance element 113, a first switch element 111 and a second switch element 112. A first end M of the resistance element 113 is electrically connected to the target node P through the first switch element 111, and a second end of the resistance element 113 is electrically connected to one of the first interface A and the second interface B. The second switch element 112 is electrically connected to the first end M of the resistance element 113 and the target node P.

In an embodiment, as shown in FIG. 5, the resistance element 113 is a resistor R. On the left side of the target node, the first interface A can be connected to the node M through the resistor R, the node M is connected to the target node P through the first switch element 111, two ends of the second switch element 112 are connected to the node M and the target node P respectively and thereby the second switch element 112 is connected in parallel with the first switch element 111. On the right side of the target node, the target node P is connected to a node N through another first switch element 111, two ends of another second switch element 112 are connected to the node N and the target node P respectively and thereby the another second switch element 112 is connected in parallel with the first switch element 111 between the node N and the target node P, and the node N can be connected to the second interface B through another resistor R. In some embodiments, a number of the resistor R may be one or multiple (i.e., more than one). When the number of the resistor R is multiple, a connection manner among the multiple resistors R may be in series or/and in parallel.

It can be understood that the connection mentioned in the above embodiments can refer to electrical connection.

In a practical application, the second switch element 112 can be configured to be enabled at a high level. Before the chip is powered on, reset and enabled, the control circuit 120 can control a control signal S2 (such as voltage) for the second switch element 112 to be kept at a low level, at this time, the second switch element 112 is in a turn-off state. The first switch element 111 can be configured to be enabled at a low level, and the control circuit 120 can control a control signal S1 for the first switch element 111 to maintain at the same voltage as the terminal nodes, i.e. the first interface A and the second interface B, before the chip is powered on and reset, thereby inhibiting the electrical conduction of the first switch element 111, i.e. the first switch element 111 is in a turn-off state. At this time, both the first switch element 111 and the second switch element 112 are in turn-off states, so that the terminal resistance circuit 100 remains in the turn-off state as a whole, which can avoid the abnormal operation of the system of the chip caused by the electrical conduction of the terminal resistance circuit 100 during the powering-on of the chip, and thereby improve the working stability of the chip.

Figure 6:
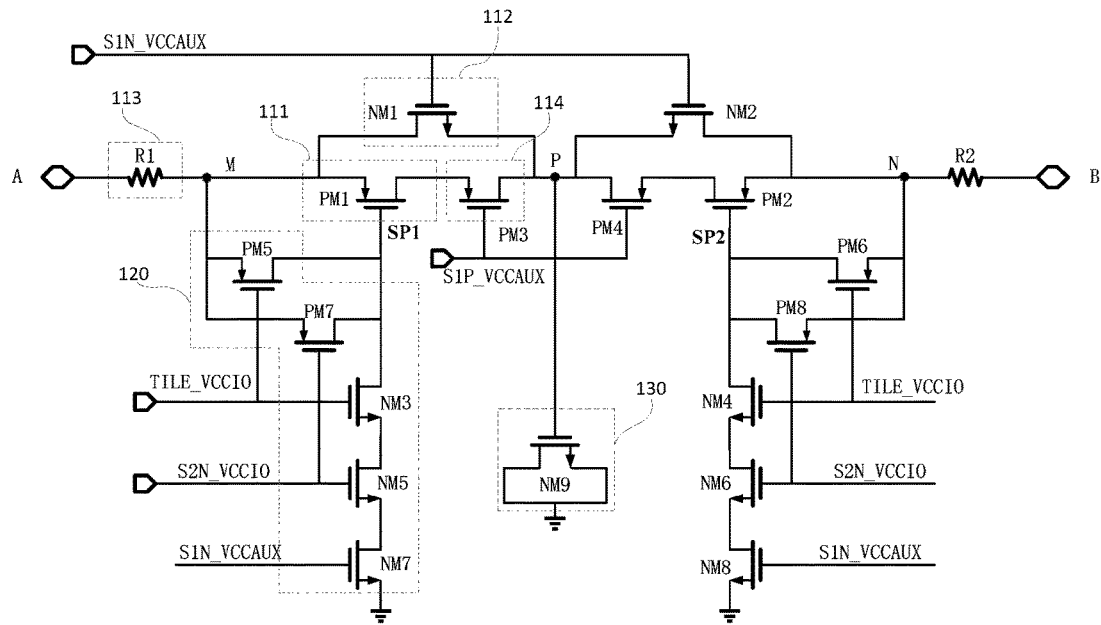
FIG. 6 illustrates a schematic circuit principle diagram of a terminal resistance circuit according to an embodiment of the present disclosure.

As shown in FIG. 6, the first switch element 111 may include a first MOS transistor PM1 (or PM2), a source of the first MOS transistor PM1 (or PM2) is electrically connected to the first end of the resistance element, a drain of the first MOS transistor PM1 (or PM2) is electrically connected to the target node P, and a gate of the first MOS transistor PM1 (or PM2) is electrically connected to the control circuit 120. The first MOS transistor PM1 (or PM2) may be a P-type MOS transistor.

In a practical application, the resistance element can be the resistor R1 (or R2). At one side of the target node P, the source of the first MOS transistor PM1 is electrically connected to the first end M of the resistor R1, the drain of the first MOS transistor PM1 is electrically connected to the target node P, and the gate of the first MOS transistor PM1 is electrically connected to the control circuit 120. At the other symmetrical side of the target node P, the source of the first MOS transistor PM2 is electrically connected to the first end N of the resistor R2, the drain of the second MOS transistor PM2 is electrically connected to the target node P, and the gate of the second MOS transistor PM2 is electrically connected to the control circuit 120. In some embodiments, resistance values of the resistor R1 and resistor R2 each can be 50Ω.

As shown in FIG. 6, the control circuit may include a first P-type MOS transistor PM5 (or PM6), a second P-type MOS transistor PM7 (or PM8), a first N-type MOS transistor NM3 (or NM4), a second N-type MOS transistor NM5 (or NM6), and a third N-type MOS transistor NM7 (or NM8).

A source of the first P-type MOS transistor PM5 (or PM6) is electrically connected to the first end M (or N) of the resistance element, a drain of the first P-type MOS transistor PM5 (or PM6) is electrically connected to the gate of the first MOS transistor PM1 (or PM2), and a gate of the first P-type MOS transistor PM5 (or PM6) is connected to a first designated control port TILE_VCCIO.

A source of the second P-type MOS transistor PM7 (or PM8) is electrically connected to the first end of the resistance element, a drain of the second P-type MOS transistor PM7 (or PM8) is electrically connected to the gate of the first MOS transistor PM1 (or PM2), and a gate of the second P-type MOS transistor PM7 (or PM8) is connected to a second designated control port S2N_VCCIO.

A drain of the first N-type MOS transistor NM3 (or NM4) is electrically connected to the gate of the first MOS transistor PM1 (or PM2), a source of the first N-type MOS transistor NM3 (or NM4) is electrically connected to a drain of the second N-type MOS transistor NM5 (or NM6), and a gate of the first N-type MOS transistor NM3 (or NM4) is electrically connected to the first designated control port TILE_VCCIO.

A source of the second N-type MOS transistor NM5 (or NM6) is electrically connected to a drain of the third N-type MOS transistor NM7 (or NM8), and a gate of the second N-type MOS transistor NM5 (or NM6) is electrically connected to the second designated control port S2N_VCCIO.

A source of the third N-type MOS transistor NM7 (or NM8) is grounded, and a gate of the third N-type MOS transistor NM7 (or NM8) is electrically connected to a third designated control port S2N_VCCAUX.

It can be understood that in the terminal resistance circuit of the above illustrated embodiment, the first P-type MOS transistor PM5 and the first P-type MOS transistor PM6 are symmetrical with respect to the target node P, the second P-type MOS transistor PM7 and the second P-type MOS transistor PM8 are symmetrical with respect to the target node P, the first N-type MOS transistor NM3 and the first N-type MOS transistor NM4 are symmetrical with respect to the target node P, and the second N-type MOS transistor NM5 and the second N-type MOS transistor NM6 are symmetrical with respect to the target node P, the third N-type MOS transistor NM7 and the third N-type MOS transistor NM8 are symmetrical with respect to the target node P, so that connection modes of components on two symmetrical sides of the target node can refer to each other, and thus are not repeated herein.

As shown in FIG. 6, the second switch element 112 may include a second MOS transistor NM1 (or NM2), a source of the second MOS transistor NM1 (or NM2) is electrically connected to the target node, a drain of the second MOS transistor NM1 (or NM2) is electrically connected to the first end M (or N) of the resistance element, and a gate of the second MOS transistor NM1 (or NM2) is electrically connected to the third designated control port. The second MOS transistor NM1 (or NM2) may be a N-type MOS transistor.

Figure 7:
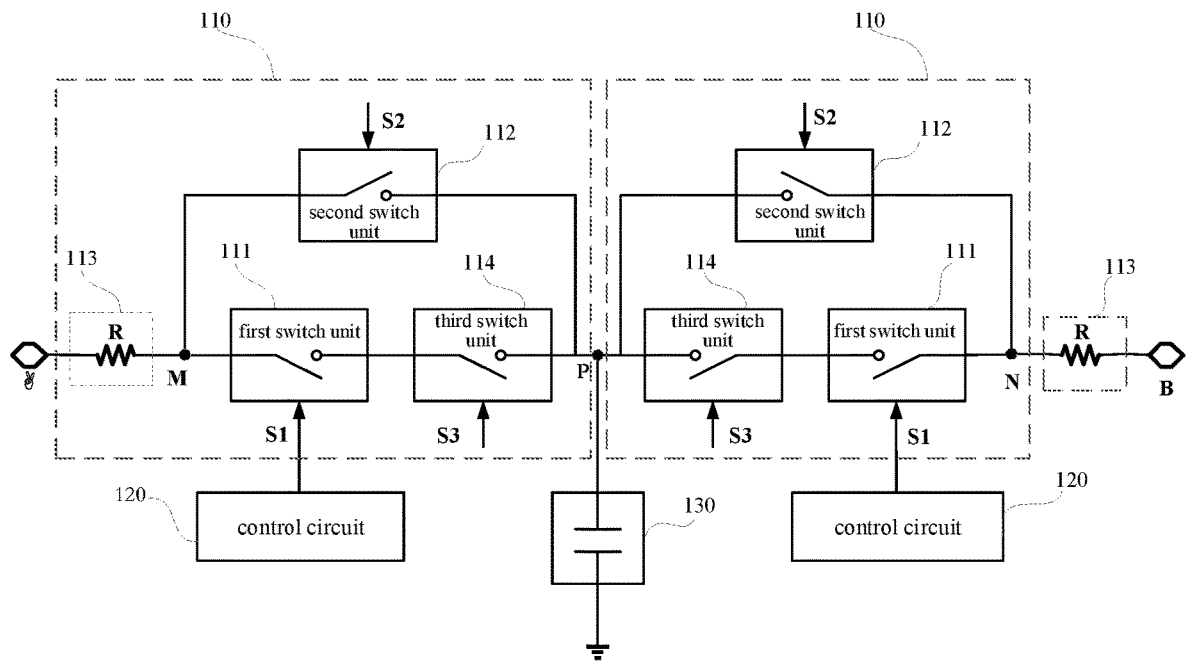
FIG. 7 illustrates a schematic structural view of a terminal resistance circuit according to another embodiment of the present disclosure.

In some embodiments, as shown in FIG. 7, the resistance circuit 110 may further include a third switch element 114, and the third switch element 114 is electrically connected to the first switch element 111 and the target node P.

It can be understood that the control circuit 120 can generate the control signal S1 for the first switch element, the control signal S2 for the second switch element, and a control signal S3 for the third switch element.

As shown in FIG. 6, the third switch element 114 may include a third MOS transistor PM3 (or PM4). A source of the third MOS transistor PM3 (or PM4) is electrically connected to the drain of the first MOS transistor PM1 (or PM2), a drain of the third MOS transistor PM3 (or PM4) is electrically connected to the target node, and a gate of the third MOS transistor PM3 (or PM4) is electrically connected to a fourth designated control port SIP_VCCAUX. The third MOS transistor PM3 (PM4) may be a P-type MOS transistor.

In the illustrated embodiment, since the resistance circuit 110 further includes the third switch element 114, and the third switch element 114 is electrically connected to the first switch element 111 and the target node P, after the VCCAUX is powered on and before the switch is enabled, the second switch element is in a turn-off state, thereby further ensuring that the terminal resistance circuit is in the turn-off state during the powering-on of the chip.

In some embodiments, as shown in FIG. 7, the terminal resistance circuit 100 may further include a filter capacitor element 130. An end of the filter capacitor element 130 is electrically connected to the target node P, and the other end of the filter capacitor element 130 is grounded.

Considering that in high-speed applications, especially when a data transmission rate reaches more than 1 Gbps, a difference between an output impedance of a driver and an impedance of a signal pathway would lead to reflection from a transmission medium to an incident edge of an output end of the driver and weaken the driving ability of the driver. At the same time, an output common-mode of the signal will change greatly, and such high-frequency common-mode voltage change is difficult to be corrected by common-mode feedback, which would eventually limit the data transmission rate. In the illustrated embodiment, by designing the filter capacitor element at the target node P of the terminal resistance circuit, when applying in a circuit, the target node P is the common-mode point of the signal. Therefore, the adding of the filter capacitor element herein can well stabilize input and output common-mode voltages of high-frequency signal.

It should be noted that the first switch element, the second switch element, the third switch element, the filter capacitor element and the control circuit in the above embodiments can also be implemented by embodiments other than the above embodiments. For example, the second switch element can include two NMOS transistors or a plurality of NMOS transistors connected in series, the control circuit can be implemented by MOS transistors with different series-connected orders, the filter capacitor element can be implemented by other type of capacitor such as a metal capacitor and variable capacitors in CMOS process, and their specific implementations are not limited herein.

It should be noted that when the terminal resistance circuit of the above embodiments is applied to low-frequency applications, the filter capacitor element 130 can be omitted, because the large filter capacitor needs to consume/occupy the chip area.

In addition, the terminal resistance circuit of the illustrated embodiments also can be applied to I/O common-mode feedback, to detect a common-mode voltage of differential I/Os. When control ends of the MOS switch resistor are in disabled states, which can ensure that the two ends of I/Os are in a turn-off state, and the system is more reliable than a mode of the NMOS switch series-connected resistor in the related art.

As shown in FIG. 7, a terminal resistance circuit provided by another embodiment can include: two resistance circuits 110. The two resistance circuits 110 are connected in series with each other, an end of the two resistance circuits 110 connected in series is connected to a first interface A, and another end of the two resistance circuits 110 connected in series is connected to a second interface B. The two resistance circuits 110 are symmetrically arranged with respect to a target node P. Each of the two resistance circuits 110 may include a first switch element 111, a second switch element 112, a resistance element 113 and a third switch element 114. The first switch element 111, the third switch element 114 and the resistance element 113 are sequentially connected in series. An end of the series-connected first switch element 111, the third switch element 114 and the resistance element 113 is connected to the first interface A, and another end of the series-connected first switch element 111, the third switch element 114 and the resistance element 113 is connected to the target node P. The second switch element 112 is connected in parallel with the series-connected first switch element 111 and the third switch element 114.

In a practical application, please refer to FIG. 6 again. each of the two symmetrical first switch elements 111 can include a PMOS transistor PM1/PM2, and sizes of the PM1 and the PM2 are the same. Each of the two symmetrical second switch elements 112 can include a NMOS transistor NM1/NM2, and sizes of the NM1 and the NM2 are the same. Each of the two symmetrical third switch elements 114 include a PMOS transistor PM3/PM4, and sizes of the PM3 and the PM4 are the same. The switch control circuit 120 on a left side of a central line of the terminal resistance circuit 100 can include PM5, PM7, NM3, NM5 and NM7. The switch control circuit 120 on a right side of the central line of the terminal resistance circuit can include PM6, PM8, NM4, NM6 and NM8, in which, PM5 and PM6 have the same size, PM7 and PM8 have the same size, NM3 and NM4 have the same size, NM5 and NM6 have the same size, and NM7 and NM8 have the same size. The filter capacitor element can include a NM9. Each of the two symmetrical resistor elements 113 may include the resistor R1/R2, the resistor R1 and the resistor R2 have the same size and are symmetrical.

As shown in FIG. 6, an end of the resistor R1 is connected to the first interface A, the first interface A is a pin PAD of the high-speed differential I/O pair, the other end of the resistor R1 is connected to a node M, PM1 and PM3 are connected in series, the source of PM1 is connected to the node M, the drain of PM3 is connected to the target node P, and the drain of PM1 is connected to the source of PM3, NM1 is connected in parallel with the series-connected PM1 and PM3, the source of NM1 is connected to the common-mode node P, the drain of NM1 is connected to the node M. The source of PM5 of the control circuit 120 is connected to the node M, and the drain of PM5 is connected to the gate SP1 of PM1. PM7 and PM5 of the control circuit are connected in parallel, the source of PM7 is connected to the node M, and the drain of PM7 is connected to SP1. The three NMOS transistors of NM3, NM5 and NM7 of the control circuit are connected in series. The drain of NM3 is connected to SP1, the source of NM3 is connected to the drain of NM5, the source of NM5 is connected to the drain of NM7, and the source of NM7 is grounded.

As shown in FIG. 6, an end of the resistor R2 is connected to the second interface B, the second interface B is the other pin PAD of the high-speed differential I/O pair, the other end of the resistor R2 is connected to a node N. PM2 and PM4 are connected in series, the source of PM2 is connected to the node N, the drain of PM4 is connected to the common-mode node P, and the drain of PM2 is connected to the source of PM4. NM2 is connected in parallel with the series-connected PM2 and PM4, the source of NM2 is connected to the target node P, and the drain of NM2 is connected to the node N. The source of PM6 of the control circuit 120 is connected to the node N, and the drain of PM6 is connected to the gate SP2 of PM2. PM8 and PM6 of the control circuit 120 are connected in parallel, the source of PM8 is connected to the node N, and the drain of PM8 is connected to SP2. The three NMOS transistors of NM4, NM6 and NM8 of the control circuit are connected in series. The drain of NM4 is connected to SP2, the source of NM4 is connected to the drain of NM6, the source of NM6 is connected to the drain of NM8, and the source of NM8 is grounded.

The filter capacitor element can include a transistor of NM9. The gate of NM9 is connected to the target node P, and the source and drain of NM9 are grounded to form an NMOS capacitor. At this time, the target node P is the common-mode node.

The gates of PM3 and PM4 of the third switch elements 114 are connected to an input control end S1P_VCCAUX of the terminal resistance circuit. The gates of NM1 and NM2 of the second switch elements 112 are connected to an input control end S1N_VCCAUX of the terminal resistance circuit. The gates of PM5, PM6, NM3 and NM4 of the control circuits 120 are connected to an input control end TILE_VCCIO of the terminal resistance circuit. The gates of PM7, PM8, NM5, and NM6 of the control circuits 120 are connected to an input control end S2N_VCCIO of the terminal resistance circuit. The gates of NM7 and NM8 of the control circuits 120 and the gates of NM1 and NM2 of the second switch element are connected to S1N_VCCAUX.

As shown in FIG. 6, S1N_VCCAUX as a first control positive end of the terminal resistance circuit, S1N_VCCAUX is enabled at a high level. VCCAUX is an auxiliary power supply voltage of the IOB module of the FPGA chip. The input control end S1P_VCCAUX as a first control negative end of the terminal resistance circuit, S1P_VCCAUX is enabled at a low level. When a voltage value of S1N_VCCAUX is equal to the VCCAUX, PMS/PM4 of the third switch element 114 is turned off, and when the voltage value of S1N_VCCAUX is equal to the VSS, PMS/PM4 of the third switch element 114 is turned on.

As shown in FIG. 6, TILE_VCCIO as a second control end of the terminal resistance circuit, TILE_VCCIO can be indirectly connected to a power supply VCCIO of the I/O pair by the circuit design, VCCIO is a main power supply of the IOB module of the FPGA chip, generally, VCCIO can support different voltage domains, such as for different standards, can selected to 1.8V, 1.5V, 1.2V, and so on. The auxiliary power supply VCCAUX is generally fixed voltage, such as VCCAUX=1.8V, the gate of NM1/NM2 of the second switch element 112 is controlled by the VCCAUX voltage, it can ensure that the on resistance of NM1 and NM2 will not change due to the change of grid voltage, which can reduce the sensitivity of terminal resistor and make the resistance value of the equivalent terminal resistor relatively stable.

As shown in FIG. 6, S2N_VCCIO as a third control end of the terminal resistance circuit, can be configured to be enabled as a high level, the power domain is VCCIO.

In a practical application, a working process of the terminal resistance circuit of this embodiment can be as follows:

Before the powering-on of VCCAUX and VCCIO, the voltages of all control ends are in logic "0" state, assuming that A and B pins of the I/O pair of the FPGA are driven by the external circuit, pin A is in a logic "high" state, pin B is also in the logic "high" state, and nodes M and N are in a high-level state. Since the chip has not been powered on, the gate voltages of PM5, PM6, PM7 and PM8 are in the logic "0" state, and PM5, PM6, PM7 and PM8 are turned on, the gate SP1 of PM1 and the gate SP2 of PM2 of the first switch elements 111 are connected to nodes M and N respectively in the logic "high" state, therefore, PM1 and PM2 are turned off before the chip is powered on. In addition, because S1N_VCCAUX is in logic "0" state before the powering-on and resetting of VCCAUX, and NM1 and NM2 is turned off, so the terminal resistance between the A and B pins is turned off.

During the powering-on of the chip, S1N_VCCAUX, S1P_VCCAUX and S2N_VCCIO are controlled by configuration points of the terminal resistance circuit, TILE_VCCIO follows the power supply VCCIO. It can ensure that the terminal resistance circuit is always turned off before being enabled, and thereby avoid the abnormal operation of the system caused by a terminal short circuit during the powering-on.

When the chip is powered on and the configuration points are enabled, that is, S1N_VCCAUX=VCCAUX, S1N_VCCAUX=VSS, TILE_VCCIO=VCCIO and S2N_VCCIO=VCCIO, then SP1 and SP2 are pulled down to be VSS, PM1, PM2, PM3, PM4, NW, and NM2 are turned on, and the terminal resistance is turned on. At the same time, NMOS filter capacitor NM9 is connected between the common-mode node P and ground. NM9 can make the common mode voltage of differential I/O signal more stable in high-frequency applications.

It can be seen that in this embodiment, by applying the terminal resistance circuit of this embodiment to the two ends of the high-speed differential I/O pair and maintaining the terminal resistance circuit in the turn-off state before the chip or the whole application system is powered on and reset, the abnormal operation of the system caused by the short circuit of two ends of the I/O pair during the powering-on can be avoided. At the same time, by adding the filter capacitor element at the common-mode point of the terminal resistance circuit, which can effectively improve the problem of high-frequency common-mode disturbance, and make the common-mode voltage of a drive signal or an input signal at two ends of the I/O pair more stable, thereby meeting the requirements of communication protocols of differential standards such as LVDS or MIPI.

Figure 8:
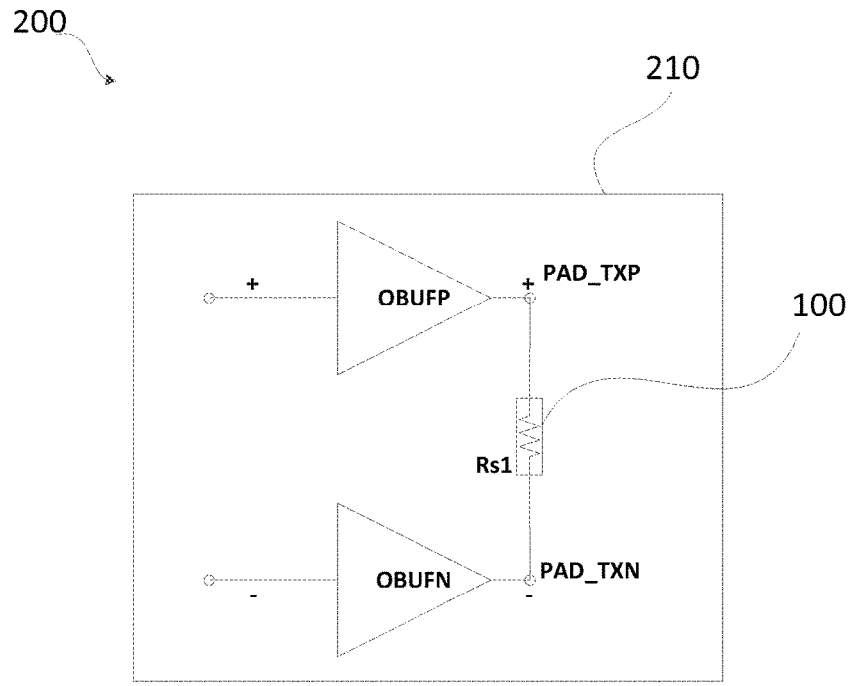
FIG. 8 illustrates a schematic structural view of a chip according to an embodiment of the present disclosure.

Please refer to FIG. 8, which illustrate a schematic structural view of the chip provided by an embodiment of the present disclosure. The chip 200 can include: a FPGA chip body 210, and the terminal resistance circuit 100 of the above embodiment.

A high-speed differential I/O pair of the FPGA chip body 210 may include a first interface PAD_TXP and a second interface PAD_TXN, and the terminal resistance circuit 100 is electrically connected to the first interface PAD_TXP and the second interface PAD_TXN.

A working process of the chip 200 can refer to the working process of the terminal resistance circuit 100 of the above embodiment, and thus will not be repeated herein.

Figure 9:
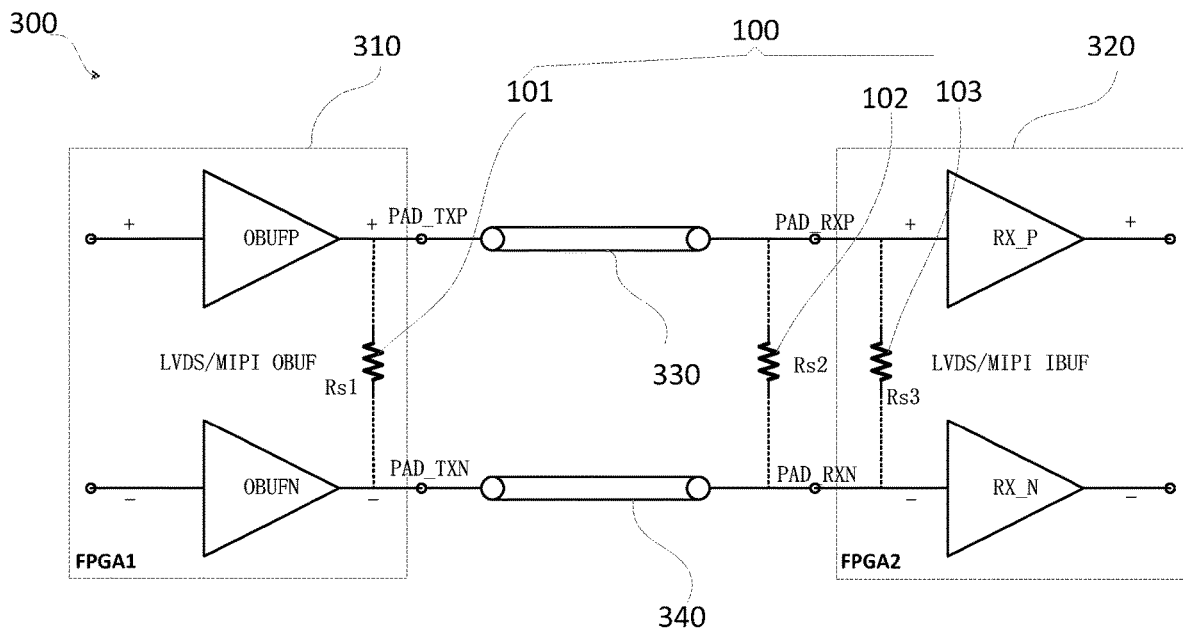
FIG. 9 illustrates a schematic structural view of a chip communication device according to an embodiment of the present disclosure.

As shown in FIG. 9, which illustrates a schematic structural view of a chip communication device provided by an embodiment of the present disclosure. The chip communication device 300 may include a first FPGA chip 310, a second FPGA chip 320, a first transmission line 330, a second transmission line 340, and three the terminal resistance circuits 100 according to any one of above embodiments. The three terminal resistance circuits 100 may include a first terminal resistance circuit 101, a second terminal resistance circuit 102 and a third terminal resistance circuit 103, and a high-speed differential I/O pair of the first FPGA chip 310 includes a first port PAD_TXP and a second port PAD_TXN, a high-speed differential I/O pair of the second FPGA chip 320 includes a third port PAD_RXP and a fourth port PAD_RXN.

The first port PAD_TXP of the first FPGA chip 310 is electrically connected to the third port PAD_RXP of the second FPGA chip 320 through the first transmission line 330, and the second port PAD_TXN of the first FPGA chip 310 is electrically connected to the fourth port PAD_RXN of the second FPGA chip 320 through the second transmission line 340.

The first terminal resistance circuit 101 is electrically connected to the first port PAD_TXP of the first FPGA chip 310 and the second port PAD_TXN of the first FPGA chip 310, and the first terminal resistance circuit 101 is integrated in the first FPGA chip 310.

The second terminal resistance circuit 102 is electrically connected to the third port PAD_RXP of the second FPGA chip 320 and the fourth port PAD_RXN of the second FPGA chip 320, and the second terminal resistance circuit 102 is arranged outside the second FPGA chip 320.

The third terminal resistance circuit 103 is electrically connected to the third port PAD_RXP of the second FPGA chip 320 and the fourth port PAD_RXN of the second FPGA chip 320, and the third terminal resistance circuit 103 is integrated in the second FPGA chip 320.

A working process of the chip communication device 300 can refer to the working process of the terminal resistance circuit 100 of the above embodiment, and thus will not be repeated herein.

Regarding the terminal resistance circuit, the chip and the chip communication device provided by the embodiments of the present disclosure, the terminal resistance circuit includes the two resistance circuits and the control circuit. One end of the two resistance circuits connected in series is electrically connected to the first interface of the high-speed differential I/O pair of the chip, and another end of the two resistance circuits connected in series is electrically connected to the second interface of the high-speed differential I/O pair of the chip. The conductor wire connected between the two resistance circuits has the target node thereon, the two resistance circuits are symmetrically arranged with respect to the target node, and the control circuit is electrically connected to the two resistance circuits individually and configured to control the two resistance circuits each to be in a turn-off state during the powering-on of the chip. Thus, the abnormal operation of system caused by the short circuit of two ends of the I/O pair during the powering-on of the chip can be avoided, and the stability of system of the chip can be improved.

Finally, it should be noted that the above embodiments are only used to illustrate the technical solutions of the present disclosure, but not intended to limit the present disclosure. Although the present disclosure has been described in detail with reference to the foregoing embodiments, it should be understood that those skilled in the art still can modify the technical solutions described in the foregoing embodiments or equivalently replace some of the technical features. These modifications or replacements do not make the essence of the corresponding technical solutions deviate from the spirit and scope of the technical solutions of the embodiments of the present disclosure.

What is claimed is:

1. A terminal resistance circuit, adapted for a high-speed differential input/output (I/O) pair of a chip; wherein the high-speed differential I/O pair comprises a first interface and a second interface, and the terminal resistance circuit comprises:
   two resistance circuits, wherein an end of the two resistance circuits connected in series is electrically connected to the first interface, another end of the two resistance circuits connected in series is electrically connected to the second interface, a conductor wire connected between the two resistance circuits has a target node thereon, and the two resistance circuits are symmetrically arranged with respect to the target node; and
   a control circuit, electrically connected to the two resistance circuits individually and configured to control the two resistance circuits each to be in a turn-off state during powering-on of the chip.

2. The terminal resistance circuit according to claim 1, wherein each of the two resistance circuits comprises a resistance element, a first switch element and a second switch element; a first end of the resistance element is electrically connected to the target node through the first switch element, and a second end of the resistance element is electrically connected to one of the first interface and the second interface; and
   wherein the second switch element is electrically connected to the first end of the resistance element and the target node.

3. The terminal resistance circuit according to claim 2, wherein the first switch element comprises a first metal-oxide-semiconductor (MOS) transistor, a source of the first MOS transistor is electrically connected to the first end of the resistance element, a drain of the first MOS transistor is electrically connected to the target node, a gate of the first MOS transistor is electrically connected to the control circuit, and the first MOS transistor is a P-type MOS transistor.

4. The terminal resistance circuit according to claim 3, wherein the control circuit comprises a first P-type MOS transistor, a second P-type MOS transistor, a first N-type MOS transistor, a second N-type MOS transistor and a third N-type MOS transistor;
   wherein a source of the first P-type MOS transistor is electrically connected to the first end of the resistance element, a drain of the first P-type MOS transistor is electrically connected to the gate of the first MOS transistor, and a gate of the first P-type MOS transistor is connected to a first designated control port;
   wherein a source of the second P-type MOS transistor is electrically connected to the first end of the resistance element, a drain of the second P-type MOS transistor is electrically connected to the gate of the first MOS transistor, and a gate of the second P-type MOS transistor is connected to a second designated control port;
   wherein a drain of the first N-type MOS transistor is electrically connected to the gate of the first MOS transistor, a source of the first N-type MOS transistor is electrically connected to a drain of the second N-type MOS transistor, and a gate of the first N-type MOS transistor is electrically connected to the first designated control port;
   wherein a source of the second N-type MOS transistor is electrically connected to a drain of the third N-type MOS transistor, and a gate of the second N-type MOS transistor is electrically connected to the second designated control port; and
   wherein a source of the third N-type MOS transistor is grounded, and a gate of the third N-type MOS transistor is electrically connected to a third designated control port.

5. The terminal resistance circuit according to claim 2, wherein the second switch element comprises a second MOS transistor, a source of the second MOS transistor is electrically connected to the target node, a drain of the second MOS transistor is electrically connected to the first end of the resistance element, a gate of the second MOS transistor is electrically connected to a third designated control port, and the second MOS transistor is a N-type MOS transistor.

6. The terminal resistance circuit according to claim 2, wherein each of the two resistance circuits further comprises a third switch element, and the third switch element is electrically connected to the first switch element and the target node.

7. The terminal resistance circuit according to claim 6, wherein the third switch element comprises a third MOS transistor, a source of the third MOS transistor is electrically connected to a drain of a first MOS transistor of the first switch element, a drain of the third MOS transistor is electrically connected to the target node, a gate of the third MOS transistor is electrically connected to a fourth designated control port, and the third MOS transistor is a P-type MOS transistor.

8. The terminal resistance circuit according to claim 1, wherein the terminal resistance circuit further comprises:
   a filter capacitor element, an end of the filter capacitor element being electrically connected to the target node, and another end of the filter capacitor element being grounded.

9. A chip, comprising: a field programmable gate array (FPGA) chip body and a terminal resistance circuit;
   wherein a high-speed differential I/O pair of the FPGA chip body comprises a first interface and a second interface; and
   wherein the terminal resistance circuit comprises:
      two resistance circuits connected in series, wherein an end of the series-connected two resistance circuits is electrically connected to the first interface, another end of the series-connected two resistance circuits is electrically connected to the second interface, a wire connected between the two resistance circuits has a target node thereon, and the two resistance circuits are symmetrically arranged with respect to the target node; and
      a control circuit, electrically connected to the two resistance circuits and configured to control the two resistance circuits each to be in a turn-off state during powering-on of the chip.

10. The chip according to claim 9, wherein each of the two resistance circuits comprises a resistance element, a first switch element and a second switch element; a first end of the resistance element is electrically connected to the target node through the first switch element, and a second end of the resistance element is electrically connected to one of the first interface and the second interface; and wherein the second switch element is electrically connected to the first end of the resistance element and the target node.

11. The chip according to claim 10, wherein the first switch element comprises a first metal-oxide-semiconductor (MOS) transistor, a source of the first MOS transistor is electrically connected to the first end of the resistance element, a drain of the first MOS transistor is electrically connected to the target node, a gate of the first MOS transistor is electrically connected to the control circuit, and the first MOS transistor is a P-type MOS transistor; and wherein the second switch element comprises a second MOS transistor, a source of the second MOS transistor is electrically connected to the target node, a drain of the second MOS transistor is electrically connected to the first end of the resistance element, a gate of the second MOS transistor is electrically connected to a third designated control port, and the second MOS transistor is a N-type MOS transistor.

12. The chip according to claim 10, wherein each of the two resistance circuits further comprises a third switch element, and the third switch element is electrically connected to the first switch element and the target node.

13. The chip according to claim 12, wherein the third switch element comprises a third MOS transistor, a source of the third MOS transistor is electrically connected to the first switch element, a drain of the third MOS transistor is electrically connected to the target node, a gate of the third MOS transistor is electrically connected to a fourth designated control port, and the third MOS transistor is a P-type MOS transistor.

14. The chip according to claim 10, wherein the control circuit comprises a first P-type MOS transistor, a second P-type MOS transistor, a first N-type MOS transistor, a second N-type MOS transistor and a third N-type MOS transistor;

wherein a source of the first P-type MOS transistor is electrically connected to the first end of the resistance element, a drain of the first P-type MOS transistor is electrically connected to the first switch element, and a gate of the first P-type MOS transistor is connected to a first designated control port;

wherein a source of the second P-type MOS transistor is electrically connected to the first end of the resistance element, a drain of the second P-type MOS transistor is electrically connected to the first switch element, and a gate of the second P-type MOS transistor is connected to a second designated control port;

wherein a drain of the first N-type MOS transistor is electrically connected to the first switch element, a source of the first N-type MOS transistor is electrically connected to a drain of the second N-type MOS transistor, and a gate of the first N-type MOS transistor is electrically connected to the first designated control port;

wherein a source of the second N-type MOS transistor is electrically connected to a drain of the third N-type MOS transistor, and a gate of the second N-type MOS transistor is electrically connected to the second designated control port; and wherein a source of the third N-type MOS transistor is grounded, and a gate of the third N-type MOS transistor is electrically connected to a third designated control port.

15. The chip according to claim 9, wherein the terminal resistance circuit further comprises:
a filter capacitor element, an end of the filter capacitor element being electrically connected to the target node, and another end of the filter capacitor element being grounded.

16. A chip communication device, comprising: a first FPGA chip, a second FPGA chip, a first transmission line, a second transmission line and three terminal resistance circuits;

wherein the three terminal resistance circuits comprise a first terminal resistance circuit, a second terminal resistance circuit and a third terminal resistance circuit; a high-speed differential I/O pair of the first FPGA chip comprises a first port and a second port, and a high-speed differential I/O pair of the second FPGA chip comprises a third port and a fourth port;

wherein the first port of the first FPGA chip is electrically connected to the third port of the second FPGA chip through the first transmission line, and the second port of the first FPGA chip is electrically connected to the fourth port of the second FPGA chip through the second transmission line;

wherein the first terminal resistance circuit is integrated in the first FPGA chip;

wherein the second terminal resistance circuit is arranged outside the second FPGA chip;

wherein the third terminal resistance circuit is integrated in the second FPGA chip;

wherein each of the first through third terminal resistance circuits comprises:
resistance circuits connected in series, wherein a wire connected between the resistance circuits has a target node thereon; and
a control circuit, electrically connected to the resistance circuits and configured to control the resistance circuits each to be in a turn-off state during powering-on of the chip;

wherein an end of the series-connected resistance circuits of the first terminal resistance circuit is electrically connected to the first port, another end of the series-connected resistance circuits of the first terminal resistance circuit is electrically connected to the second port, and wherein an end of the series-connected resistance circuits of the second terminal resistance circuit is electrically connected to the third port, another end of the series-connected resistance circuits of the second terminal resistance circuit is electrically connected to the fourth port; and wherein an end of the series-connected resistance circuits of the third terminal resistance circuit is electrically connected to the third port, another end of the series-connected resistance circuits of the third terminal resistance circuit is electrically connected to the fourth port.

17. The chip communication device according to claim 16, wherein each of the resistance circuits comprises a resistance element, a first switch element and a second switch element; wherein a first end of the resistance element is electrically connected to the target node through the first switch element, the second switch element is electrically connected to the first end of the resistance element and the target node;

wherein a second end of the resistance element of the first terminal resistance circuit is electrically connected to one of the first port and the second port;

wherein a second end of the resistance element of the second terminal resistance circuit is electrically connected to one of the third port and the fourth port; and wherein a second end of the resistance element of the third terminal resistance circuit is electrically connected to one of the third port and the fourth port.

18. The chip communication device according to claim 17, wherein each of the resistance circuits further comprises a third switch element, and the third switch element is electrically connected to the first switch element and the target node.

19. The chip communication device according to claim 17, wherein the control circuit comprises a first P-type MOS transistor, a second P-type MOS transistor, a first N-type MOS transistor, a second N-type MOS transistor and a third N-type MOS transistor;

wherein a source of the first P-type MOS transistor is electrically connected to the first end of the resistance element, a drain of the first P-type MOS transistor is electrically connected to the first switch element, and a gate of the first P-type MOS transistor is connected to a first designated control port;

wherein a source of the second P-type MOS transistor is electrically connected to the first end of the resistance element, a drain of the second P-type MOS transistor is electrically connected to the first switch element, and a gate of the second P-type MOS transistor is connected to a second designated control port;

wherein a drain of the first N-type MOS transistor is electrically connected to the first switch element, a source of the first N-type MOS transistor is electrically connected to a drain of the second N-type MOS transistor, and a gate of the first N-type MOS transistor is electrically connected to the first designated control port;

wherein a source of the second N-type MOS transistor is electrically connected to a drain of the third N-type MOS transistor, and a gate of the second N-type MOS transistor is electrically connected to the second designated control port; and wherein a source of the third N-type MOS transistor is grounded, and a gate of the third N-type MOS transistor is electrically connected to a third designated control port.

20. The chip communication device according to claim 16, wherein each of the first through third terminal resistance circuits further comprises:

a filter capacitor element, an end of the filter capacitor element being electrically connected to the target node, and another end of the filter capacitor element being grounded.

\* \* \* \* \*